United States Patent [19]

Rösler

[11] 4,337,526
[45] Jun. 29, 1982

[54] MONOLITHICALLY INTEGRABLE SEMICONDUCTOR MEMORY

[75] Inventor: Helmut Rösler, Munich, Fed. Rep. of Germany

[73] Assignee: Siemens Aktiengesellschaft, Berlin and Munich, Fed. Rep. of Germany

[21] Appl. No.: 157,946

[22] Filed: Jun. 9, 1980

[30] Foreign Application Priority Data

Jun. 18, 1979 [DE] Fed. Rep. of Germany ....... 2924526

[51] Int. Cl.³ .......................................... G11C 11/40
[52] U.S. Cl. .................................... 365/238; 365/230
[58] Field of Search ................. 340/173 SM; 365/230, 365/238

[56] References Cited

U.S. PATENT DOCUMENTS 3,763,480 10/1973 Weimer ........................ 340/173 SM
3,772,658 11/1973 Sarlo ............................ 340/173 SM
3,893,088 7/1975 Bell ............................. 340/173 SM Primary Examiner—Terrell W. Fears
Attorney, Agent, or Firm—Herbert L. Lerner; Laurence A. Greenberg

[57] ABSTRACT

Monolithically integrated semiconductor memory including memory cells disposed in parallel rows and parallel columns transverse to the rows, and electric lines connecting the memory cells of the respective rows and columns to one another, the memory cells individually being constructed as clock-controlled shift register cells.

4 Claims, 3 Drawing Figures

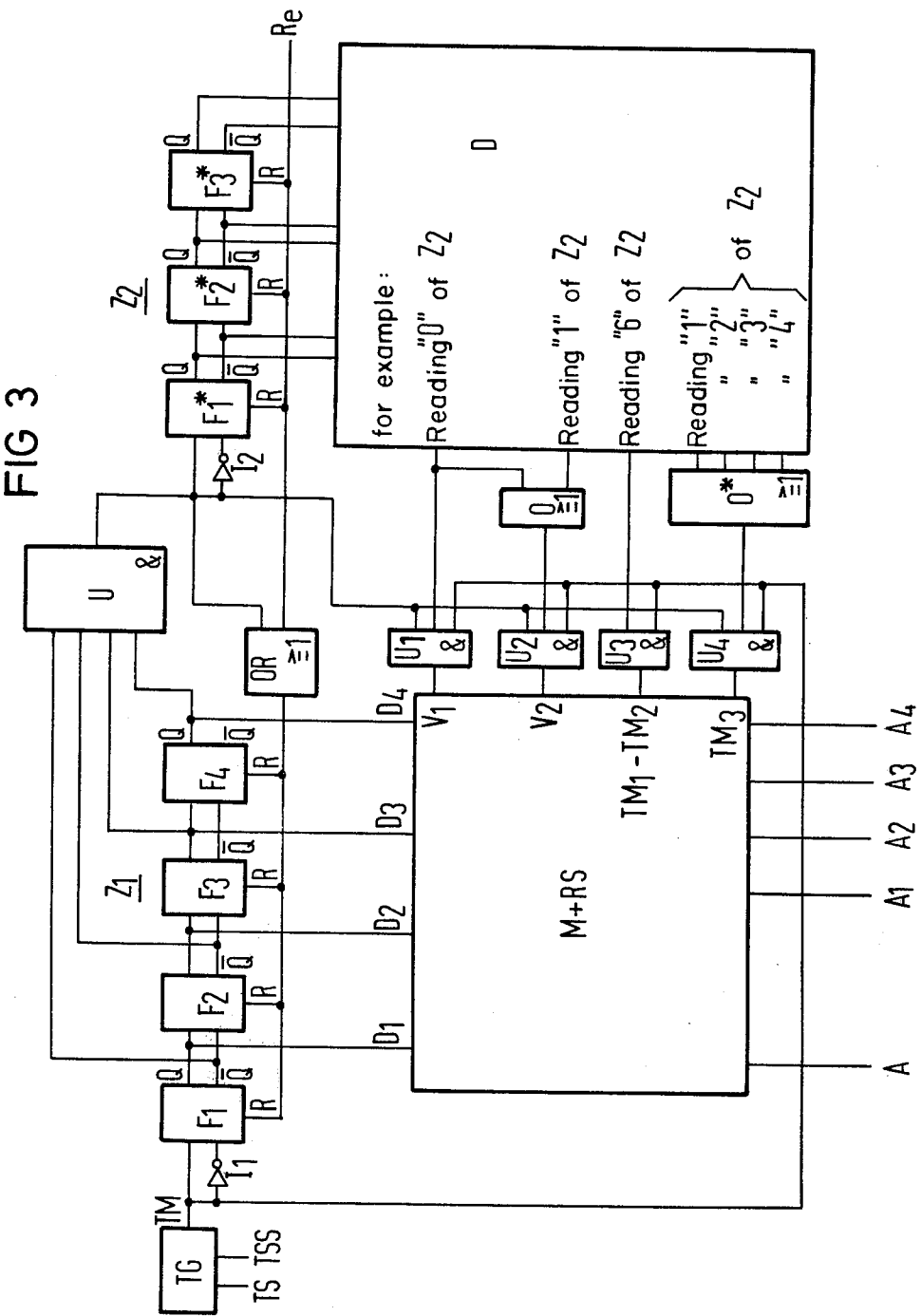

MONOLITHICALLY INTEGRABLE SEMICONDUCTOR MEMORY

The invention relates to a monolithically integrated semiconductor memory with memory cells arranged along parallel rows and columns, the memory cells belonging to the individual rows and columns being connected to each other by means of suitably extending lines.

Memory cells in heretofore known memories of this general type are either individual elements or memory cells constructed from several circuit elements, namely flipflop cells. It is a common feature of all of these memory cells that they can assume two logical states, namely the state of "0" and the state of "1". Besides matrix memories there are also serial memories wherein the individual memory cells are exclusively connected in series i.e. so that they thus are not addressable simultaneously as in the matrix memories. Shift registers are an exception inasmuch as shift pulses can be fed to all cells of the respective register simultaneously. With regard to the information to be stored, however, the individual cells of a shift register are connected in series in the same manner as in other serial memories.

It is an object of the invention of the instant application to provide a monolithically integrated semiconductor memory which represents a link between matrix memories and serial memories and which is capable of solving certain problems in a relatively simpler manner for which microprocessors have heretofore been used.

With the foregoing and other objects in view, there has been provided in accordance with the invention, a monolithically integrated semiconductor memory comprising memory cells arranged along parallel rows and columns, the memory cells belonging to the individual rows and columns being connected to each other by means of suitably extending electric lines, the individual memory cells being constructed as pulse-controlled shift register cells.

General aspects advantageous for the further development of the invention are set forth initially hereinafter.

1. It is most advantageous and in accordance with another feature of the invention to construct the individual memory cells as quasi-static shift register cells because these require less circuitry than pulse-controlled flipflop cells used as shift register cells. If quasi-static shift register cells are used, a somewhat more complicated clock pulse sequence is necessary, however, than if pulse-controlled flipflop cells are used as memory cells.

2. The register cells of the first row (or the first column) of the matrix serve jointly as information inputs, so that the information is read-in in parallel in the form of a binary word. All of the memory cells of the first matrix line (or the first matrix column) together form a clock-controlled shift register within which the respective information, read-in in parallel, can be transported, for example, from the left to the right (or from top to bottom) up to the output of the respective shift register represented by the last register cell of the first matrix row (or by the lowest register cell of the first matrix column).

3. The register cells located in the individual matrix rows, as a whole, as well as the register cells contained in the individual matrix columns, as a whole, form respective shift registers. If the matrix has m rows and n columns, there is a total of (m+n) shift registers.

4. The clock or pulse supply of the aforementioned shift registers, as a whole, can be provided, on the one hand, by a common clock or pulse sequence or combination of clock or pulse sequences. However, different clock or pulse sequences can also be allocated to the individual rows (or columns, respectively) of the matrix, which is the case, particularly, when information readout in accordance with predetermined aspects of factors is to be achieved.

With the foregoing and other objects in view, there is provided, in accordance with the invention, a monolithically integrated semiconductor memory comprising memory cells disposed in parallel rows and parallel columns transverse to the rows, and electric lines connecting the memory cells of the respective rows and columns to one another, the memory cells individually being constructed as clock-controlled shift register cells.

In accordance with another feature of the invention, the shift register cells are quasistatic.

In accordance with a further feature of the invention, the semiconductor memory includes connecting circuit means for the memory cells, individually, for combining, in a matrix thereof, the shift register cells disposed in the respective rows, on the one hand, as well as the shift register cells disposed in the respective columns, on the other hand, so as to form respective clock-controlled shift registers.

In accordance with an added feature of the invention, the semiconductor memory includes a common first clock frequency source connected to the row-parallel shift registers of the matrix, and a common second clock frequency source connected to the column-parallel shift registers of the matrix.

In accordance with additional features of the invention, the shift register cells are quasistatic and, respectively, have a NOR gate with an output, forming the output of the respective cell, the NOR gate having two inputs, one of the inputs being addressable by a resetting signal, the other of the inputs being addressably connected to a transfer transistor, the transfer transistor being controllable by a first clock pulse sequence and being preceded by an inverter connected thereto, the inverter having a signal input connected via another transfer transistor to the output of the NOR gate and forming the output of the respective shift register cell, the other transfer transistor having a gate controllable by a second clock pulse sequence substantially synchronous with the pulses of the first clock pulse frequency, and two additional clock-controlled transfer transistors connected to the signal input, the signal input being switchable for row-parallel shift register operation, on the one hand, via one of the additional clock-controlled transfer transistors by a first clock-signal, and being switchable for column-parallel shift register operation, on the other hand, via the other of the additional clock-controlled transfer transistors.

In accordance with yet another feature of the invention, the semiconductor memory includes means connected to the additional clock-controlled transfer transistor for applying an activating signal thereto for connecting the memory cells of the first row of the matrix in parallel with a plurality of data inputs.

In accordance with yet a further feature of the invention, the semiconductor memory includes means for switching the memory cells of the first row of the matrix serially to a single information input.

In accordance with yet an added feature of the invention, the semiconductor memory includes a common first clock frequency source connected to the row-parallel shift registers of the matrix, and a common second clock frequency source connected to the column-parallel shift registers of the matrix, the respectively common first and second clock frequency sources deriving from a common generating system having means for preventing simultaneous applicatin of pulses of both the first and second pulse sequences.

In accordance with yet an additional feature of the invention, the semiconductor memory includeds a further shift register in addition to the shift registers of the memory matrix, the further shift register being addressable by data inputs of the memory matrix.

In accordance with another feature of the invention, the semiconductor memory includes a clock pulse generator for delivering pulses of a clock pulse sequence, the clock pulse generator being connected to a binary counter for controlling the binary counter, and a decoder connected to the binary counter and actuable in response to at least one counter reading thereof for generating the first and second pulse sequences, respectively.

In accordance with a concomitant feature of the invention, the semiconductor memory includes a clock pulse generator for delivering pulses of a clock pulse sequence, the clock pulse generator being connected to a binary counter for controlling the binary counter, and a decoder connected to the binary counter and actuable in response to at least one counter reading thereof for generating the activating signal.

Other features which are considered as characteristic for the invention are set forth in the appended claims.

Although the invention is illustrated and described herein as embodied in a monolithically integrable semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 3 is a block diagram of the memory of FIG. 1 connected to a system for deriving the auxiliary signals required for controlling the memory matrix.

Figure 1:
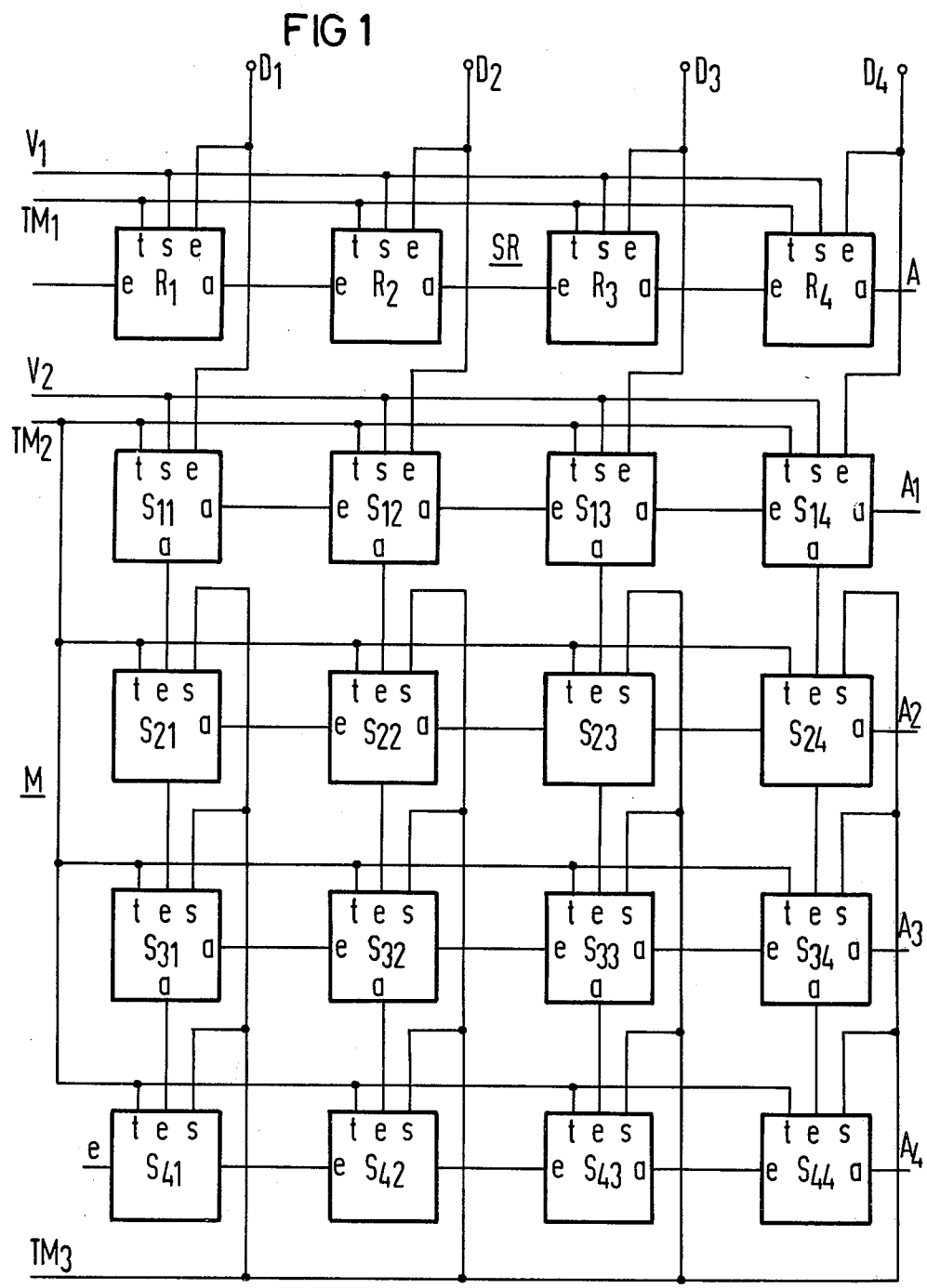
FIG. 1 is a block diagram of an embodiment of the monolithically integrable semiconductor memory according to the invention, details regarding the individual memory cells being omitted therefrom.

Referring now to the drawing and first, particularly, to FIG. 1 thereof, there is shown a matrix M formed of four rows and four columns and, therefore, of eight shift register cells $S_{11}$, $S_{12}$, ... $S_{14}$, $S_{21}$, $S_{22}$, ... $S_{43}$, $S_{44}$. Hereinafter, the individual cells of the matrix M are identified by the reference character $S_{ik}$, the subscript "i" meaning the number of the respective row, and the subscript "k" meaning the number of the respective column of the matrix M wherein the respective element is disposed. Each of the shift register cells $S_{ik}$ has a clock or pulse input t and at least one information input e as well as at least one input s for a switching signal $V_2$. Within the matrix M, the shift register cells $S_{ik}$ disposed within the individual matrix rows and matrix columns are connected together, in accordance with the sequence thereof within the respective row or column, in such a way that the information of a given register cell $S_{ik}$ is connected to the corresponding signal output a of the register cell $S_{i-1,k}$ as well as of the register cell $S_{i,k-1}$, while the signal output a of the register cell $S_{ik}$ is connected to the information input e of the register cells $S_{i+1,k}$ and $S_{i, k+1}$.

By means of this circuit, the register cells $S_{ik}$ with $k = 1, 2 ... n$ located within each row i of the matrix form a complete shift register with an output $A_i$. Furthermore, all of the register cells $S_{ik}$, as a whole, with $i = 1, 2, ... m$ located within each column k of the matrix together likewise form a shift register so that the matrix M is composed of (m+n) individual shift registers, wherein m is the number of the rows thereof and n the number of the columns thereof. The shift registers corresponding to the matrix columns can also be provided, if required, with a signal output defined by the respective last cell $S_{mk}$ of the individual matrix columns.

The information inputs $D_k$ ($k = 1, 2, ... n$) of the matrix M serve moreover, in the illustrated embodiment shown in the figures, for driving a further shift register SR consisting of the cells $R_k$ ($k = 1, 2, ... n$) with the output A, which, however, is not provided for driving the matrix M but receives, in parallel operation, the information present at the respective inputs $D_1, D_2, ... D_n$ i.e. a respective applicable digital word consisting of n bits, and transmits it serially via the output A to further parts of the circuit which are not described herein since any further description thereof is believed to be immaterial to the invention. A clock or pulse frequency $TM_1$ is provided for controlling the shift register SR, and an activation signal $V_1$ is provided for activating it.

To supply the register cells $S_{ik}$ of the memory matrix M with clock or timing pulses, a clock or pulse signal $TM_2$ is provided which appears simultaneously at the clock or pulse inputs t of all the register cells $S_{ik}$ of the matrix M, as can be seen in FIG. 1. Finally, a further clock or pulse frequency $TM_3$ is provided which is applied to the cells $S_{ik}$ of the matrix in a manner yet to be described herein.

The practical embodiment of the circuit shown as a block diagram in FIG. 1, as mentioned hereinbefore, is produced in a most simple manner and is most advantageous with respect to integrability, if so-called quasi-static shift register cells are used as the memory cells $S_{ik}$. This is the case in the embodiment illustrated in FIG. 2.

The quasi-static shift register cells $S_{ik}$ are formed, in a conventional manner, of three MOS field-effect transistors of the enhancement type, respectively, which serve as transfer transistors. The signal input e of the individual cell $S_{ik}$ is connected via the source-drain path of a first transistor $T_1$ to the input of an inverter I and, furthermore, to the source-drain path of a transfer transistor $T_3$. The output of the inverter I is connected via the source-drain path of a transfer transistor $T_2$ to the one input of a NOR gate N, the other input of which can be controlled by a resetting signal Re. Via the series connection of the two transfer transistors $T_1$ and $T_3$, the signal input e of the quasi-static shift register cell $S_{ik}$ is connected to the output a of the quasi-static shift register cell, the output a being formed by the output of the NOR gate N. A common clock or timing pulse signal TS is provided for controlling the gates of the transfer transistors $T_2$ of all of these quasi-static shift register cells $R_k$ and $S_{ik}$, and for controlling the gates of the transfer transistors $R_3$, a common clock or timing pulse signal TSS is provided. If the respective cell belongs to the supplemental shift register SR and a cell $R_k$ is thus involved, the gates of the input transfer transistors $T_1$ are controlled by the clock frequency $TM_1$, and if the respective cell belongs to the matrix M proper i.e. in the case of the cells $S_{ik}$, the gates are controlled by the clock or pulse frequency $TM_2$. Both clock or pulse frequencies $TM_1$ and $TM_2$ are derived, together with the hereinaforementioned clock or pulse frequency $TM_3$, from a clock or pulse signal TM which is generated, together with the clock or pulse frequencies TS and TSS, from a common clock or timing pulse generator. The latter is advantageously constructed in accordance with the embodiments described in co-pending U.S. application Ser. No. 072,975, filed Sept. 6, 1979 and assigned to the same corporate assignee as that of the instant application.

The clock or pulse generator described in ths co-pending application is capable of delivering three periodic clock or timing pulse sequences TM, TS and TSS, which have the same frequency. The clock or pulse sequence TM is formed of time-wise equidistant square-wave pulses having the levels "0" and "1". The same applies to the clock or pulse sequence TS. However, the pulse of the sequence TM are so adjusted relative to the pulses of the sequence TS that the pulses TS have a level "1" only if no pulse of the sequence TM has the level "1". Moreover, between the flanks of the individual pulses of TM and the flanks of the respective adjacent individual pulses of the sequence TS, a non-vanishing time difference is provided, so that an overlapping of pulses of the sequence TM by pulses of the sequence TS or an overlapping of pulses TS by pulses TM is basically impossible. The individual pulses of the sequence TSS coincide time-wise with the individual pulses of the sequence TS, which applies exactly for the transitions from "1" to "0". On the other hand, contrary to the pulses TS, the individual pulses of the sequence TSS have noticeably inclined, rising transitions from "0" to "1" and, therefore, a noticeably shorter duration of the lever "1" for the individual pulses TSS as compared to the pulses TS.

The data inputs $D_k$ serve, as mentioned hereinbefore, for driving the data input e of a respective one of the register cells $S_{lk}$ of the first row of the matrix M. For this purpose, there is assigned to each of the cells $S_{lk}$ a further transfer transistor $T_4$, which is controlled via the activating signal $V_2$ and via which the data input $D_k$ is connected to the input of the inverter I of the respective associated shift register cell $S_{lk}$ while bypassing the transfer transistor $T_1$ which is controlled by the clock or pulse frequency $TM_2$. The activating signal $V_2$ is derived from the clock or pulse frequencies of the sequence TM, as are the clock or pulse frequencies $TM_1$, $TM_2$ and $TM_3$ and the activating signal $V_1$.

The connection between the information output a of the cell $S_{lk}$ and the information input e of the respective following cell $S_{1,k+l}$ of the first row of the matrix M is provided by respective conducting connection which extends in the interior of the following cell $S_{1,k+l}$ via the transfer transistor $T_1$ controlled by the clock or pulse frequency $TM_2$ up to the input of the NOR gate N of the respective cell. Thus, the transfer transistors $T_1$ and $T_4$ both serve to control the feeding of information to the input e per se of the quasi-static shift register cell $S_{lk}$, realized by the input of the inverter I. It is immediately apparent that if a clock pulse from the sequence $TM_2$ occurs, all the register cells $S_{lk}$, as a whole, of the first matrix row operate as a shift register leading to the output $A_1$, whereas, upon the occurrence of a clock pulse $V_2$, the information present at the date inputs $D_k$ is read in parallel into this shift register and, accordingly, into the matix M while, upon the occurrence of a clock pulse $TM_2$, the information read into the cells $S_{lk}$ of the first matrix row is shifted by one cell in direction toward the output $A_1$ within the shift register provided by these cells.

The connection of the shift register cell $S_{ik}$ in the remaining rows of the matrix M i.e. in the rows 2 to m, is similar. Accordingly, the input e of the respective cell, given by the register cell $S_{ik}$ located in the respective row under consideration, is connected, on the one hand, via the transfer transistor which is controlled by the clock or pulse frequency $TM_2$ which forms the clock or pulse input t, to the output a of the cell $S_{i, k-l}$ preceding in the same row. Furthermore, these register cells $S_{ik}$ also have an additional transfer transistor $T_5$ with i≠1, which is controlled by the hereinaforementioned clock or pulse frequency $TM_3$ and which connects the information input of the corresponding cell, which is provided by the input of the inverter I of the respective register cell $S_{ik}$, to the signal output a of the cell $S_{i-l,k}$ i.e. to the preceding register cell in the respective matrix column.

It is immediately apparent that, through the activation of the transfer transistor $T_1$ by the signal $TM_2$, the register cells within the individual rows complement each other to form a shift register while, through activation of the transfer transistors $T_5$ by the signal $TM_3$, the register cells located within the individual columns, in turn, together form a shift register.

The outputs of the matrix M are provided by the signal outputs a of the register cells $S_{in}$ of the last matrix column. The signal outputs a of the register cells $S_{mk}$ of the last matrix row may also serve, if desired or necessary, as further outputs. The date inputs $D_k$ of the matrix M are connected to the data input a of a respective register cell $R_k$ of the supplemental shift register SR similarly to the register cells $S_{ik}$ of the first matrix row, and permit, in this manner a parallel write-in of the information present at the inputs $D_k$ into this shift register SR. To this end, the respective data input $D_k$ is connected to the input e of the respective associated register cell $R_k$ via the source-drain path of a respective transfer transistor $T_4^+$, while the connection between the output of the cell $R_k$ and the respective following cell $R_{k+l}$ is established via the transfer transistor $T_1$ of the respective register cell $R_{k+l}$. All the transfer transistors $T_4^+$, as a whole, are controlled by the signal $V_1$ which is derived from the clock pulses TM like the signal $V_2$. All the transfer transistors $T_1$, as a whole, of the cells $R_k$ of the supplemental shift register SR, on the other hand, are controlled by the hereinaforementioned clock pulses $TM_1$, which are likewise obtained by means of the clock pulses TM.

Figure 2:
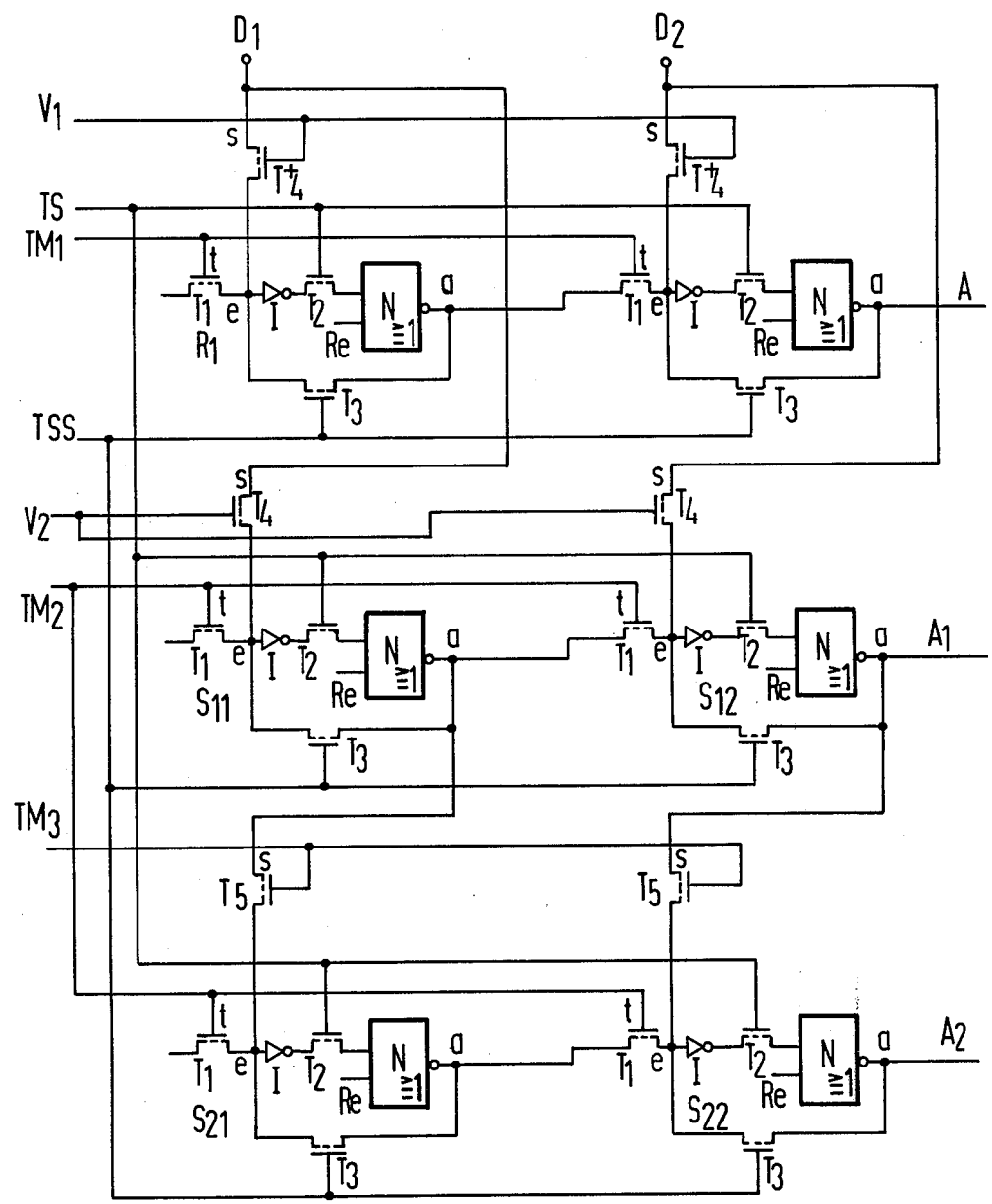
FIG. 2 is a fragmentary circuit diagram of the block diagram of FIG. 1 showing the use of quasi-static shift register cells and the connection thereof.

With regard to generating the signals $TM_1$, $TM_2$, $TM_3$, $V_1$ and $V_2$, which are required for operating the circuit according to FIGS. 1 and 2, reference is made to FIG. 3.

In the circuit shown in FIG. 3, the memory matrix M and the shift register SR are indicated by a common block M+RS. A common clock or pulse generator TG is provided. It is suitable for delivering the pulse sequences TS, TSS and a pulse sequence TM. The pulses appear with the same frequency. The output of the clock or pulse generator TG supplying the pulse sequence TS is connected to the gates of the transfer transistors $T_2$ of all of the shift register cells $S_{ik}$ and $R_k$. The output of the clock or pulse generator TG supplying the pulses TSS is connected to the gates of the transistors $T_3$ of the just-mentioned shift register cells $S_{ik}$ and $R_k$. The output of the clock or pulse generator TG supplying the pulses TM is connected to the one input and, via an inverter $I_1$, to the other input of a binary counter $Z_1$ formed of four counting stages $F_1$ to $F_4$. The number of counting stages $F_k$ of the binary counter $Z_1$ corresponds in the general case to the number of data inputs $D_k$ and, therefore, to the number n of the columns of the memory matrix M. Accordingly, the individual counting stages $F_k$ of the binary counter $Z_1$ are respectively associated with a data input $D_k$ and the register cells $S_{ik}$ and $R_k$ addressed by the latter. In the case of the illustrated embodiment, the counting stages $F_k$ are provided by a respective toggle flipflop. Accordingly, the Q-outputs of the counting stages $F_k$ carry the counter reading in the sequence of the disposition or order thereof in the binary couner $Z_1$, and the $\bar{Q}$-outputs the inverted counter reading. Consequently, the Q-output of the counting state $F_k$ is connected to the data input $D_k$ of the matrix M.

A predetermined counter reding of the binary counter $Z_1$ serves for controlling an AND gate U. In the embodiment shown in FIG. 3, this is the counter reading "12". With this counter reading, a "0" is present at the Q-outputs of the counting stage $F_4$ and the counting stage $F_3$, and a "1" is present at the Q-outputs of the counting stages $F_1$ and $F_2$. Accordingly, in order to control the AND gate U, which has four inputs, exclusively by the counter reading "12", it is necessary to connect the Q-outputs of the counting stages $F_1$ and $F_2$ and the $\bar{Q}$-outputs of the counting stages $F_3$ and $F_4$ to a respective input of the AND gate U, as is apparent from FIG. 3. When the counter reading "12" is reached, a pulse appears at the output of the AND gate U; this pulse has the following purposes:

1. The pulses supplied by the AND gate serve as counting pulses for a second binary counter $Z_2$ which forms, as it were, an extension of the first binary counter $Z_1$. For, every time the counter reading "12" appears, the counting input of the second binary counter $Z_2$ receives a pulse, by means of which the counter reading of the second counter is formed.

2. The pulses supplied by the AND gate U serve, moreover, to control an OR gate OR, the other input of which can be controlled by resetting pulses Re. The output of this OR gate OR is connected to the resetting inputs R of the first binary counter $Z_1$, while the resetting inputs R of the second binary counter $Z_2$ are addressed directly by the resetting pulses. Consequently, the first binary counter $Z_1$ switches every time to the counter reading "0", if the AND gate U responds (i.e. in the case of the example, after the counter reading "12" is reached). In addition, the two counters are switched simultaneously to the counter reading "0", if a resetting pulse Re, which can be generated, for example, via the clock or pulse generator TG or another part of the circuit, in a conventional manner, is present.

While the number of counting stages of the counter $Z_1$ is equal to the number n of the columns k of the matrix M, and the number of the different counter readings of the counter $Z_1$ is accordingly given by $2^{n+1}-1$, the number of counter stages $F_j^*$ ($j=1, 2, 3, \ldots$) of the second binary counter $Z_2$ depends upon the factors or criteria which are to be served in each individual case by the circuit. It is the purpose of the binary counter $Z_2$ to control the generation of the clock pulses $TM_1$, $TM_2$, $TM_3$ as well as the activating signals $V_1$ and $V_2$ by means of a decoder D. In this connection, care must be taken that the pulses $TM_2$ and $TM_3$ do not appear simultaneously, while this may be desirable in many cases for the pulses $TM_1$ and $TM_2$. A numerical example for the counter readings at which the pulses $V_1$, $V_2$ and so forth appear, is provided in FIG. 3.

With respect to the construction of the second binary counter $Z_2$ as well as of the counter stages $F_j$ thereof, the same applies as for the counter $Z_1$.

In the case of the example, a counter $Z_2$ is formed of the counter stages $F_1^*$, $F_2^*$, $F_3^*$, the one input of the first counter stage $F_1^*$ being connected directly, and the second input of this counter stage via an inverter $I_2$ to the output of the AND gate U. The decoder D is controlled by the various outputs Q and $\bar{Q}$. Since the internal construction of the decoder D follows generally known guide lines, a detailed description thereof is believed to be unnecessary and is therefore dispensed with.

The logic circuitry connecting the decoder D and the inputs for the control pulses $TM_1$, $TM_2$, $TM_3$, $V_1$ and $V_2$. The AND gate $U_1$ serves for generating the signal $V_1$. It has three inputs, of which the first is controlled by the output of the AND gate U, the second by the clock or pulse frequency TM furnished by the clock or pulse generator TG, and the third by the decoder D in accordance with certain states or conditions of the counter $Z_2$. In the case of the example, this is the counter reading "0".

The AND gate $U_2$ serves for generating the signal $V_2$. It likewise has three inputs, of which the first is controlled by the AND gate U, the second by the clock or pulse frequency TM and the third by the decoder D via the OR gates 0 for the counter readings "0" and "1" of the counter $Z_2$. The AND gate $U_3$, which serves for generating the pulse sequences $TM_1$ and $TM_2$, has two inputs of which the one is controlled by the decoder D (for example, for the counter reading "6" of $Z_2$).

The clock or pulse frequency $TM_3$ serves the purpose of permitting a shift of the information in the matrix M parallel to the columns. The AND gate $U_4$ is provided for generating this clock or pulse frequency $TM_3$ and has a first input controlled by the AND gate U, a second input is controlled by the clock or pulse generator TM and a last input controlled through the intermediary of the OR gate O via the decoder D for the counter readings "1", "2", "3", and "4", of the binary counter $Z_2$.

It should be noted that the hereinafore-described manner of controlling the matrix M via the binary counter $Z_2$ is applicable to only one embodiment of the invention which is intended for a quite specific purpose (control of an electronic organ). Accordingly, the number of counting stages of the second binary counter $Z_2$ depends, in this case, upon the number of states or conditions required for the clock or timing pulse control (as well as on the number of octaves used), so that the different states or conditions can be ensured in particular for this purpose.

The clock or pulse frequencies TM, TS and TSS are supplied continuously by the clock or pulse generator TG. If an activating signal $V_1$ occurs, the information present at the data inputs $D_k$ is transferred in parallel into the supplemental shift register SR and, if an activating signal $V_2$ occurs, into the shift register provided by all the memory cells $S_{lk}$ of the first row of the matrix M. For transmitting the information from the first row of the matrix M into the second row and to the following rows, respectively, a clock or pulse frequency $TM_3$ is required whereas, if a clock or pulse frequency $TM_2$ occurs, the information can take place within the shift register defined by the respective matrix row, up to the output $A_i$ thereof. It is therefore advisable that the clock pulses $TM_2$ and $TM_3$ do not appear simultaneously.

The following mode of operation, for example, is possible: the occurring binary words are introduced into the first shift register SR serially or in parallel, which is the case each time a clock pulse $V_1$ occurs. Similarly, the informatin is transferred; upon the occurance of the activating pulse $V_2$, into the shift register provided by the first matrix row, which is likewise possible by reading-in in parallel via the data inputs $D_k$ as well as by serial input via the first register cell $S_{11}$ of the first row through the intermediary of the clock pulses $TM_2$ (which then occurs without interruption by clock or timing pulses $TM_3$). Further oncoming data words are accepted, respectively, after the information stored in the first matrix row is transferred into the second matrix row and from there into the third row, and so forth, in parallel or in series, by the shift register provided by the first matrix row. For example, the acceptance of information and the passing-on of information in the supplemental shift register SR can be blocked, if the activating pulses $V_1$ are not given. In the embodiment of the invention shown in FIG. 1, the four words entered last are thereby left standing in the shift registers represented by the rows of the matrix M, and the word entered first is left standing in the supplemental shift register SR. All of these shift registers can then be addressed by the (simultaneously appearing) pulses $TM_1$ and $TM_2$, so that the respective stored binary words appear at the outputs $A, A_1 \ldots A_m$, that is, for example, $A, A_1$ to $A_4$.

Should, for example, the first three and the last two binary words be picked out and stored instead, then the first three words are to be provided in three successive shift registers corresponding to the shift register SR, into which the words can be inserted in parallel or serially. The control unit supplies further shift pulses only to the remaining two shift registers. Then, only the two last words are stored therein. It is also possible to connect the individual shift registers in series. However, the individual parts receive shift pulses only when a word appears which, for example, deviates from the zero or blank information.

The digital words to be processed may come from different sources. One possible source is the first binary counter $Z_1$, of which the counter outputs $\overline{Q}$ and possibly also $Q$ are then associated with a respective one of the data inputs $D_k$, depending upon the sequence of the counting stages $F_k$ and the sequence of the columns k of the matrix M i.e. they are connected, in this case, directly and indirectly, respectively, to the respective data input $D_k$.

The possibility is furthermore left open to associate an individual shift clock or pulse frequency, respectively, with each of the row-parallel shift registers and with each of the column-parallel shift registers, respectively, of the matrix M, with a corresponding modification of the clock or pulse generator and clock or pulse supply.

There are claimed:

1. Monolithically integrated MOS semiconductor circuit, comprising a memory matrix having identical memory cells in the form of individual adjacent clock-controlled shift register cells disposed in rows and columns including a first row and column, each of said memory cells having an information input terminal and an information output terminal, at least one of said terminals of each given memory cell being connected to another memory cell disposed in one of the same column and the same row as said given memory cell in accordance with a given sequence of said memory cells in respective rows and columns, said input terminals of said memory cells in at least one of said first row and column each forming an information input of said memory matrix in which said output terminal of said individual memory cells is in the form of a NOR gate having first and second inputs and an output, said first input of said NOR gate being a resetting input, each given memory cell having a first transfer transistor controlled by a first pulse sequence, a second transfer transistor controlled by a second pulse sequence, and at least one clock-controlled transfer transistor each having source-drain paths, and an inverter having an input and an output, said second input of said NOR gate being connected through the source-drain path of said first transfer transistor to the output of said inverter, said output of said NOR gate being fed back through said source-drain path of said second transfer transistor to the input of said inverter, the input of said inverter also forming the signal input terminal of said given memory cell, said signal input terminal of said given memory cell being connected through the source-drain path of said at least one clock-controlled transfer transistor to one of, the output terminal of the adjacent memory cell in the same row as said given memory cell, the output terminal of the adjacent memory cell in the same column as said given memory cell, and an information input of said memory matrix, the corresponding transfer transistor of each memory cell being jointly clock-controlled by the same clock signal preventing said transfer transistors connected to the information input terminals and said transfer transistors connected to said NOR gates from simultaneously opening.

2. Semiconductor circuit according to claim 1, including a further clock-controlled input shift register supplying the information input terminals of said memory cells of one of said first row and column with information in parallel operation, said further input shift register having cells identical to said memory cells of said matrix memory, said first and second transfer transistors connected between said inverters and said NOR gates of said further input shift register being jointly controlled by the same pulse sequences as said corresponding transfer transistors of said memory cells, first clock pulse sources connected to said at least one clock-controlled transfer transistors of said memory cells for information transfer from said further input shift register to said memory matrix through said at least one clock-controlled transfer transistors of said memory cells, second clock pulse sources addressing said at least one clock-controlled transfer transistors of said further input shift register, and third clock pulse source for supplying clock pulses for transfering information between memory cells of said memory matrix, said first and second clock pulse sources having pulses appearing at different times than said first and second pulse sequences controlling said first and second transfer transistors of said memory cells and at different times than said clock pulses from said third clock pulse sources.

3. Semiconductor circuit according to claim 2, including a clock generator supplying said first and second pulse sequences substantially synchronously with each other for controlling said first and second transfer transistors connected between said inverters and said NOR gates of said memory cells of said matrix memory and said further input shift register, and supplying a further pulse sequence, said further pulse sequence supplying timing pulses lying in intervals between the pulses of said first pulse sequence controlling said first transfer transistors connected between said inverters and the inputs of said NOR gates.

4. Semiconductor circuit according to claim 3, including first and second binary counters, a first AND gate having inputs and an output, a plurality of second AND gates each having an output and three inputs and a decoder, said first binary counter including a plurality of series-connected counting stages and a counting input connected to said clock generator for receiving said further pulse sequence, said counting stages having outputs controllably connected to the inputs of said first AND gate and connected to the information inputs of said memory matrix, the output of the first AND gate being connected to said second binary counter for supplying counting pulses thereto and being controllably, connected to one of said inputs of said plurality of second AND gates, the output of each of said plurality of second AND gates supplying one pulse sequence of the pulses for receiving and passing on information in said memory matrix, another input of said plurality of second AND gates being controllably connected to said second binary counter through said decoder, and a further input of said plurality of second AND gates being connected to said clock generator for receiving said further pulse sequence driving said first binary counter.

* * * * *